US 6,392,943 B2

(12) United States Patent
Fournel

(10) Patent No.: US 6,392,943 B2
(45) Date of Patent: May 21, 2002

(54) READING DEVICE AND METHOD FOR INTEGRATED CIRCUIT MEMORY

(75) Inventor: Richard Fournel, Lumbin (FR)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/973,380

(22) Filed: Oct. 9, 2001

Related U.S. Application Data

(62) Division of application No. 09/716,173, filed on Nov. 17, 2000, now Pat. No. 6,324,112.

(30) Foreign Application Priority Data

Nov. 18, 1999 (FR) .......................................... 99 14519

(51) Int. Cl.[7] ................................................ G11C 7/00
(52) U.S. Cl. ................. 365/207; 365/203; 365/185.21; 365/210; 365/205; 365/185.25; 365/202
(58) Field of Search ............................... 365/203, 205, 365/207, 210, 202, 185.21, 185.25

(56) References Cited

U.S. PATENT DOCUMENTS

| 5,388,068 A | * | 2/1995 | Ghoshal et al. ............ 365/162 |
| 5,654,653 A | * | 8/1997 | Coyle et al. ................. 327/51 |
| 5,675,537 A | | 10/1997 | Bill et al. .............. 365/185.22 |
| 5,687,330 A | * | 11/1997 | Gist et al. .................... 395/309 |
| 5,754,475 A | | 5/1998 | Bill et al. .............. 365/185.25 |
| 5,872,739 A | | 2/1999 | Womack ..................... 365/207 |
| 5,880,988 A | | 3/1999 | Bertin et al. .................. 365/63 |
| 5,973,966 A | | 10/1999 | Calligaro et al. ...... 365/189.01 |
| RE36,579 E | | 2/2000 | Pascucci et al. ....... 365/185.21 |
| 6,069,831 A | * | 5/2000 | Tang et al. ................. 365/210 |
| 6,191,979 B1 | | 2/2001 | Uekubo ................. 365/185.25 |
| 6,307,797 B1 | * | 10/2001 | Fournel et al. ............ 365/203 |

FOREIGN PATENT DOCUMENTS

| EP | 0319066 | 6/1989 | ........... G11C/17/00 |
| EP | 0516225 | 12/1992 | ........... G11C/16/06 |
| EP | 0678874 | 10/1995 | ........... G11C/16/06 |

OTHER PUBLICATIONS

Calligaro C et al: "A Current–Mode Sense Amplifier for Low Voltage Non–Voltile Memories" Proceedings of the International Conference on Innovative Systems in Silicon (Prior to 1996 International Conference on Wafer–Scale Integration), US, New York, NY: IEEE, vol. Conf. 8, Oct. 9, 1996 pp. 141–147 XP000741808.

* cited by examiner

Primary Examiner—Viet Q. Nguyen
(74) Attorney, Agent, or Firm—Lisa K. Jorgenson; Allen, Dyer, Doppelt, Milbrath & Gilchrist, P.A.

(57) ABSTRACT

In a reading device for a memory, a circuit for the asymmetrical precharging of the differential amplifier is provided so that an output of the reading device switches over to a determined state. In the following evaluation phase, if the memory cell is programmed, the output remains unchanged. If the memory cell is blank or erased, the output of the reading device switches over to another state. A detection circuit detects a sufficient difference between the inputs of the differential amplifier for stopping the asymmetrical precharging and for making the reading device go automatically to the evaluation phase.

13 Claims, 4 Drawing Sheets

READING DEVICE AND METHOD FOR INTEGRATED CIRCUIT MEMORY

This application is a divisional of Ser. No. 09/716,173 filed on Nov. 17, 200, the disclosure of which is hereby incorporated by reference in its entirety, now U.S. Pat. No. 6,324,112.

FIELD OF THE INVENTION

The present invention relates to integrated circuits, and, more particularly, to a reading device and associated methods for an integrated circuit memory. Integrated circuit memories include erasable programmable read only memories (EPROMS) and one-time programmable (OTP) type non-volatile electrically programmable memories, for example. The present invention reduces the read access time of a memory, particularly with respect to the time taken for the data stored in one or more memory cells to become available at an output.

BACKGROUND OF THE INVENTION

The cells of a memory are usually organized in matrix form using bit lines and word lines. The bit lines are the conductors by which the state stored in a cell is read. Thus, when a memory cell is addressed in a read mode, the corresponding word line is selected and the corresponding bit line is connected to a reading device.

In general, it is not just one memory cell but several that are read for the reading of a memory word. Generally, all these cells forming a memory word belong to the same word line, and a respective bit line corresponds to each cell. In a read mode, each one of these bit lines is connected to a corresponding reading device, which are all identical.

Since the bit lines comprise a large number of cells, they are capacitive and resistive. The capacitance is a result of the sum of the individual capacitances due to the components themselves. The components include the cells, the selection transistors, and the topology of the bit lines. The resistance is because of the materials used, such as the contact resistances, the metallization and the internal resistances of the transistors of the cells.

For these reasons, the reading device usually comprises a precharging circuit to charge the equivalent capacitance of a bit line selected in a read mode to a determined precharging read voltage. Then, a current generation circuit sets up a current in the bit line. If the selected cell absorbs current, a voltage variation will be detected on the line. In the case of EPROM type memory cells, the reading device furthermore comprises a voltage limiter to limit the voltage of the bit lines to a level close to one volt to eliminate the risk of memory cells being programmed during the read access operations.

In addition, the reading is often based on a comparison between the current that flows in the cell selected in the read mode and the current that flows in a reference cell. For example, in the case of a EPROM type memory or OTP type memory, the two possible states of a storage cell are the blank state and the programmed state. The blank state is produced by erasing the cells using UV rays. The reference cells are all in the same known state, which is generally the blank state. In this state, the floating-gate transistor of the memory cell has a low threshold voltage of about 1.4 volts, for example. In the programmed state, this threshold voltage becomes higher, and may be equal to 5.5 volts, for example.

The principle of reading by comparison is based on the fact that the cell selected in the read mode is in an erased state. It can absorb as much current as the reference cell placed in the same bias conditions. If this cell is provided with only a fraction of this current, it will make the bit line voltage collapse, and this fact will be detected.

In practice, a read current generator injects a given read current Iref into the reference bit line associated with the reference cell, and it injects a fraction of this reference current (e.g., half or one third) into the data bit line associated with the cell to be read. A read differential amplifier receives a signal coming from the data bit line at the first differential input, and a signal coming from the reference bit line at the second differential input.

If the cell that is read is erased, it draws more current than the fraction of the reference current provided to it by the current generator. The first differential input is then drawn to a voltage U lower than the voltage Uref at the second input of the differential amplifier, and the output of the amplifier switches over in one direction. If, on the contrary, the cell that is read is programmed, it absorbs very low current or no current at all. The first differential input is then drawn to a voltage U higher than the voltage Uref at the second input of the differential amplifier, and the output of the amplifier switches over into the other direction.

Thus, a common reading device comprises a precharging circuit for each of the bit lines with limitation of the bit line voltage. The device also comprises a read current generator in the bit lines, and a read amplifier that provides the information at an output.

The precharging circuit is a current/voltage converter that fulfills three different functions. A first function supplies current to precharge the bit lines. A second function limits the bit line potential to a specified precharging read voltage, which eliminates the risks of programming. A third function supplies a signal to the amplifier with a voltage that varies strongly with the current on the associated bit line in the evaluation stage.

The reading device thus goes through several stages of operation. These stages include the starting up of the precharging circuits, the activation of the read current generators, the selection and precharging of the bit lines, and the selection of the word line (row decoding). The voltage levels perceived by the read amplifier are often close to $V_{DD}$, and are related not to the state of the selected cell but to the precharging circuit.

At this time, the cell selected in the read mode may or may not absorb current. If current is absorbed, such as in the case of a blank or erased cell, this current is first given by the bit line capacitance and then by the associated read current generator. This absorption of current produces a large variation of voltage in the signal applied at the input to the differential amplifier. This causes the amplifier to switch over.

However, the output of the amplifier oscillates throughout the variations on the bit lines. This slows down the setting up of the real data at the output. In practice, the sequencing operations needed to start up the various circuits of the reading device and the parasitic oscillations of the amplifier lengthen the read access time. One and a half clock cycles are needed to obtain the output data element. In one example, there is a typical read access time of 80 nanoseconds, and a maximum read access time of 130 nanoseconds.

To avoid the problem of oscillations at the output of the amplifier, there are reading devices which use a latch instead of the read differential amplifier. However, it is then necessary to plan an additional external sequencing to provide the activation signal for this latch as a function of all the time constraints and as a function of the sensitivity of the latch. This activation signal often comes from a control unit using reference circuits known as dummy circuits. These circuits are sized to obtain sufficient latitude in the light of the worst cases of propagation.

SUMMARY OF THE INVENTION

An object of the invention is to provide a very fast access reading device for a memory using a differential amplifier. In the invention, it is sought to improve the read access time of a memory. In one practical example, a maximum read access time of 25 nanoseconds is obtained instead of the typical prior art time of 80 nanoseconds. In the prior art, the reading is slowed down because of the successive sequencing operations needed and the oscillation of the amplifier.

Another object of the present invention is to provide a reading device that does not have the above described drawbacks.

A reading device according to the present invention comprises a dissymmetrical (or asymmetrical) precharging circuit to bring the input of the amplifier associated with the selected data bit line to a voltage level higher than that of the input associated with the reference bit line during the precharging phase. Consequently, the output of the amplifier is brought into a given state. In the following evaluation phase, the output of the amplifier is confirmed in this state, or else it switches over into the complementary state depending on the state stored in the cell on the selected bit line.

According to the present invention, the data and reference bit lines are precharged to a precharging read voltage of nearly one volt. This precharging is done in combination with an asymmetrical precharging of the inputs of the amplifier.

The invention also relates to a method of reading in an integrated circuit memory, wherein the method preferably comprises a precharging phase to bring a data bit line to a precharging voltage. The data bit line comprises a memory cell to be read, and a reference bit line comprises a reference cell.

A phase of evaluation includes the building-up of a reference current in the reference bit line, and a fraction of this current is built-up in the data bit line. A voltage signal given by a current/voltage converter connected to the data bit line, and a voltage signal given by a current/voltage converter connected to the reference bit line is applied respectively as a data input and as a reference input to a differential amplifier.

In the precharging phase, asymmetrical precharging is activated making it possible to bring one of the differential amplifier inputs to a voltage level higher than that of the other differential amplifier input.

BRIEF DESCRIPTION OF THE DRAWINGS

Various characteristics and advantages of the invention are described in detail in the following description given by way of a non-restrictive illustration with reference to the appended drawings, of which.

DETAILED DESCRIPTION OF THE PREFERRED EMBODIMENTS

Figure 1:
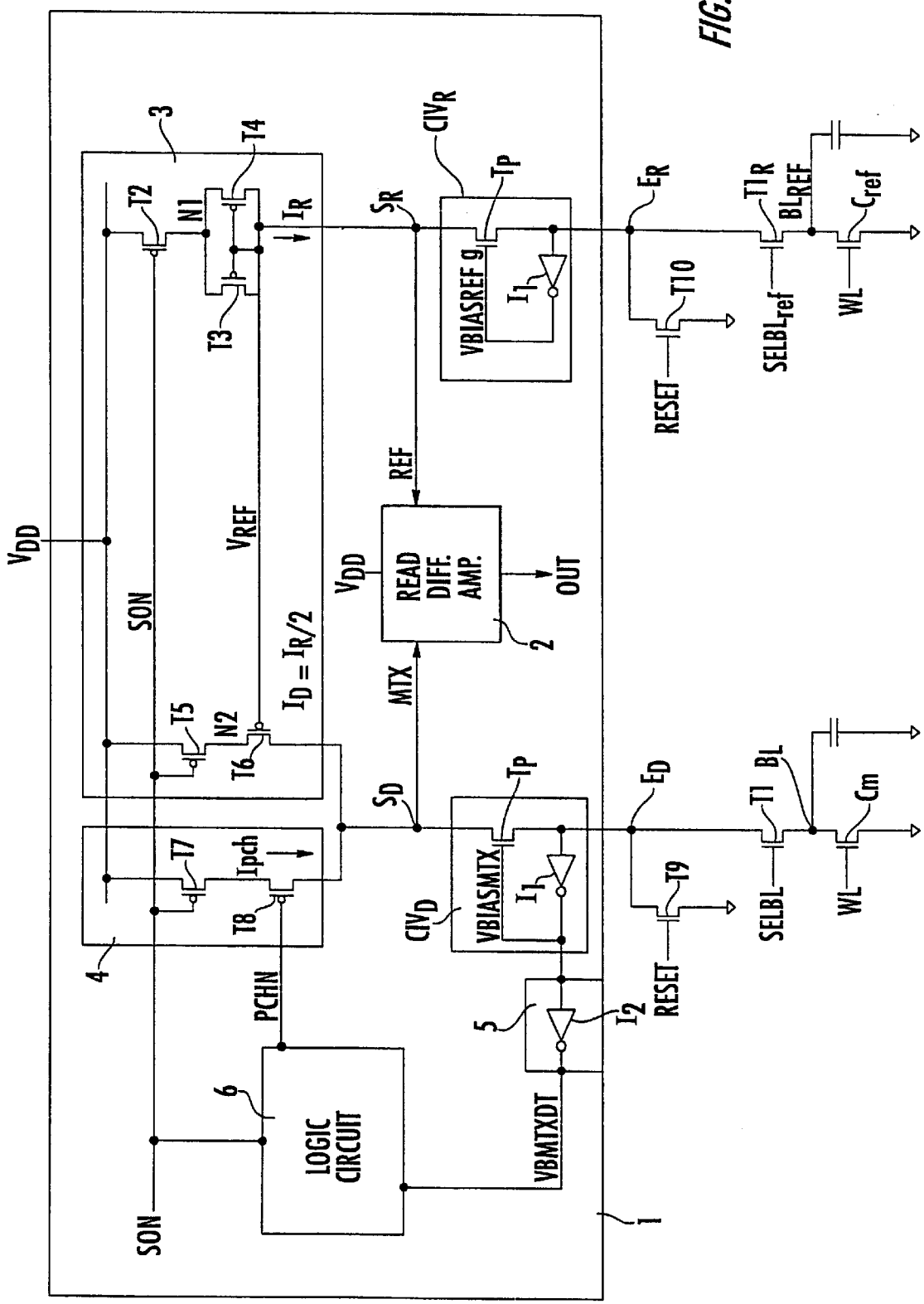
FIG. 1 is a block diagram of a memory architecture corresponding to a reading device according to the present invention.

In the description, a signal and its voltage may be designated by the same reference. FIG. 1 illustrates the architecture of a memory using a reading device according to the present invention. In the illustrated example, the memory is a EPROM type memory. A cell of this memory comprises a floating-gate transistor having its drain connected to a bit line of the memory array and its gate connected to a word line. The, reference cell or cells are generally located on one or more reference bit lines generally included in the memory array.

In certain architectures, the reference cells are outside the memory array because their word lines should be at a potential other than the potentials of the cells to be read. The complexity of the architecture of the memory may vary. The architecture may or may not include access transistors, it may include a grouping of bit lines or other lines, and the memory may be of another type, e.g., non-volatile. The invention thus applies to different memory types and different memory architectures.

When a memory cell Cm is addressed in the read mode, the data bit line BL associated with the cell to be read and a reference bit line $BL_{ref}$ are selected to be connected to a reading device 1. This selection is performed in the example by a decoding transistor. For the cell to be read, there is a decoding transistor T1 connected between the data bit line BL and an input ED of the reading device 1. For the reference cell $C_{ref.,}$ a decoding transistor is connected between a reference input ER and the reference bit line $BL_{ref}$.

In the case of a EPROM or OTP memory cell, the memory cells are selected in the read mode by the application of a read mode to their gate by the corresponding word line. In the example, the cell to be read and the reference cell have their gates connected to the same word line WL. The reading device 1 comprises a current/voltage converter CIVD on the data side and a current/voltage converter CIVR on the reference side.

The converter CIVD is connected between the input node ED and the output node SD. This output node SD of the converter CIVD is connected to the data input MTX of a read differential amplifier 2. The converter CIVR is connected between the input node ER and an output node SR. This output node SR of the converter CIVR is connected to the reference input REF of the read differential amplifier 2.

Each one of these converters, in a relatively straightforward embodiment, comprises a negative feedback loop formed by a transistor Tp and an inverter I1. The drain d of the transistor Tp is connected to the output node and gives the voltage signal to be compared to the differential amplifier. The source s of the transistor Tp is connected to the input node of the converter and is looped back to the gate g of the transistor Tp through the inverter I1 to set up an automatic control loop dictating a precharging voltage on the input node ED. The bit line that is connected thereto is precharged to this voltage. The level of this precharging voltage is set up so that the cell cannot be programmed in the read phases.

The characteristics (W/L dimensions and threshold voltage) of the transistor Tp and those of the transistors forming the inverter define the value of the precharging voltage that the converter tends to impose on the bit line. The reading device moreover comprises a read current generator 3.

This generator has a current mirror structure to set up a reference current IR on the reference bit line and a current ID equal to a fraction of this reference current on the data bit line. The reference current IR=k*ID, where k may, for example, take values ranging from 1.5 to 4 according to the characteristics of the transistors used in the current mirror structure. In the example, this current generator comprises a first arm connected to the output node SR of the converter associated with the reference bit line, and a second arm connected to the output node Sd of the converter associated with the data bit line.

The first arm comprises a selection switch transistor T2 connected between the power supply voltage VDD of the integrated circuit and a node N1, and two parallel-connected transistors T3 and T4 between this node and the output node SR. They are mounted as current mirrors with their gates and sources connected in common. When the selection switch transistor T2 is activated, the reference read current IR is obtained by applying the power supply voltage VDD to node N1. This current is mainly a function of the characteristics of the reference cell and the reference bit line. The voltage at the gates and sources connected in common is built up to a level VREF, which is the input reference voltage level REF of the differential amplifier.

In the example, the second arm comprises a selection switch transistor T5 connected between the power supply voltage VDD of the integrated circuit and a node N2, and a transistor T6 connected between this node and the output node SD. This transistor T6 has its gate controlled by the gate-source connections of the transistors T3 and T4 of the first arm. If the transistors T3, T4 and T6 are identical a data read current ID equal to IR/k is obtained when the selection switch transistor T5 is on and applies the voltage VDD to the node N2. In the example, k is equal to 2 at a first approximation. For circuits supplied at low voltage (VDD), k will preferably be taken to be lower than 2.

The reading device according to the invention furthermore comprises a circuit 4 for the asymmetrical precharging of the data and reference inputs of the amplifier. This asymmetrical precharging circuit 4 is parallel-connected to the second arm of the current generator 3. It comprises a selection switch transistor T7 and a precharging transistor T8 series-connected between the power supply voltage VDD and the output node SD. When the selection switch transistor T7 is activated, the precharging transistor T8 provides a high precharging current Ipch at a low output impedance.

The reading device thus carries out an asymmetrical precharging of the amplifier inputs, bringing one of the inputs of the amplifier to a voltage level higher than that of the other input. The voltage difference between the two inputs of the amplifier makes the output thereof switch over to a given state. In the exemplary embodiment of the invention described and shown in the figures, it is the input MTX that is taken by the asymmetrical precharging circuit to a voltage level higher than that of the other input REF.

This asymmetrical precharging must be stopped before the start of the evaluation phase in the amplifier. Advantageously, so as not to be dependent on the different variations of the charging parameters due to the operating conditions and to the characteristics of the manufacturing method, conditions are detected in which the asymmetrical precharging is stopped to make the device go into the evaluation phase. Thus, a circuit 5 is designed to detect the stopping conditions on a signal affected by the precharging.

The stopping conditions correspond to a sufficient difference in voltage between the two inputs MTX and REF. This difference is sufficient if it makes the output of the amplifier switch over to the desired state, namely a logic 0 if it is the data input MTX that is brought to a higher voltage level. These stopping conditions can be detected in various ways and with varying degrees of ease depending on the signal selected. An exemplary detection circuit shall be described in detail further below.

The detection circuit provides a stopping command signal VBMTXDT that is applied to the input of a logic circuit 6, which also receives an activation command signal SON. At its output this logic circuit 6 gives a signal PCHN to control the gate of the precharging transistor T8 of the asymmetrical precharging circuit 4 according to the invention. This is done so that the activation of the command signal SON of the reading device activates the asymmetrical precharging circuit while the activation of the stopping command signal stops it.

The signal SON for commanding the activation of the reading device is generated by a control circuit planned in the memory circuit. This signal is activated for each read access to the memory when the addressed bit line is actually connected to the read circuit, i.e., a selected bit line. In the example, the signal SON is applied as a gate command to all the supply voltage VDD selection switch transistors T2, T5 and T7 to power on the different circuits of the reading device. In general, a command of the same type is planned in the differential amplifier.

According to the invention, this signal SON also activates the asymmetrical precharging circuit according to the invention. Thus, when the line address decoding is finished by the column decoder of the memory circuit, the bit line BL is selected and actively connected to the input node ED of the reading device 1. The reference bit line $BF_{ref}$ is also actively connected to the input node ER of the reading device. The signal SON is then activated, powering on the reading device and validating the read current generator and the asymmetrical precharging circuit 4. The following auto-sequence operation is obtained.

On the data bit line side, there is a current equal to Ipch+ID, with ID given by the read current generator and Ipch>ID given by the asymmetrical precharging circuit at a very low output impedance which is characteristic of transistor T8. On the reference bit line side, there is a current Ir=2*ID given by the read current generator at a higher output impedance which is characteristic of transistors T2, T3 and T4.

The capacitance of these data bit lines and reference bit lines are charged. The precharging phase begins, which is asymmetrical. The low output impedance on the data bit line side raises this line to a level higher than that of the reference bit line. Moreover, the precharging current Ipch accelerates the precharging on the data bit line side, accentuating this asymmetry and giving an efficient read access time.

Figure 3:
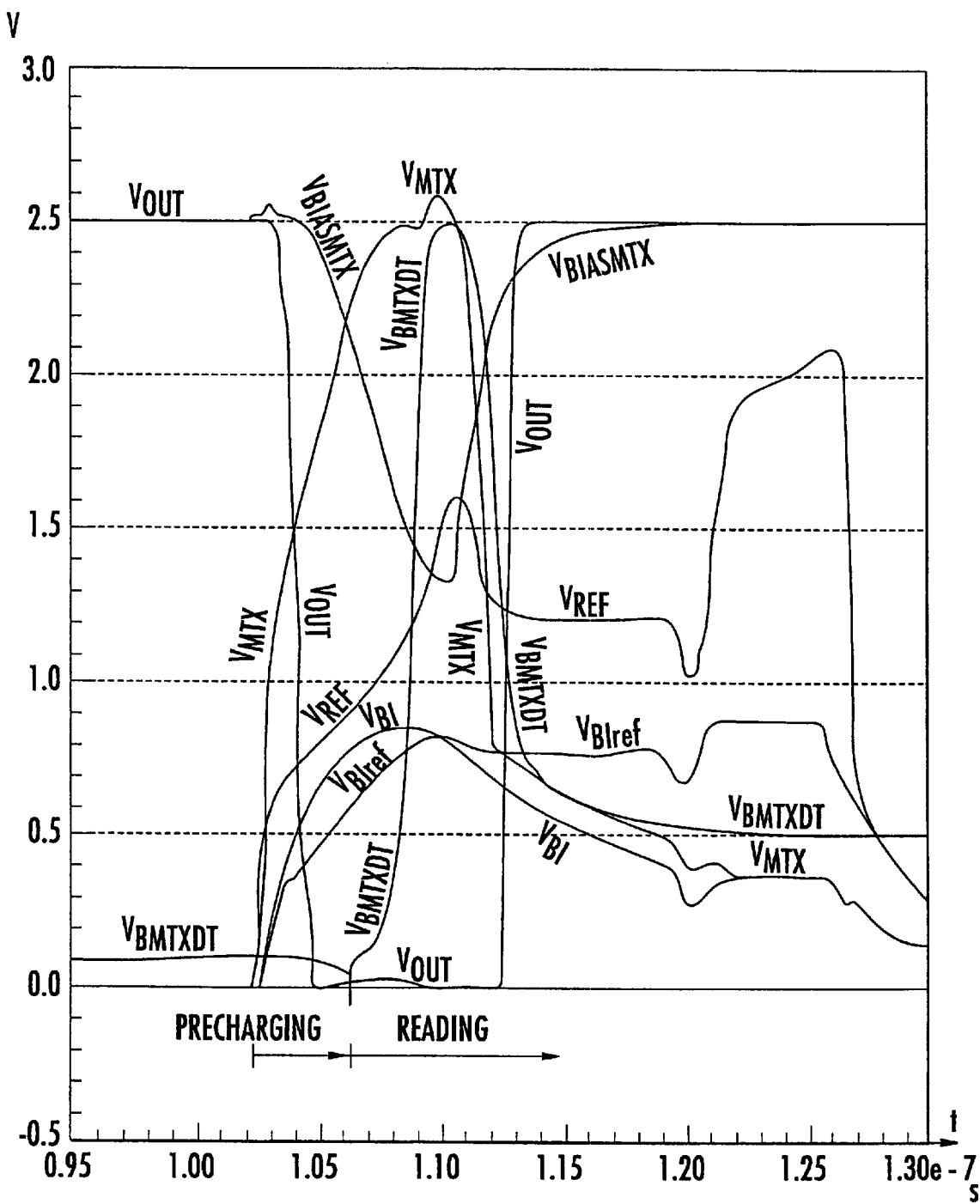
FIG. 3 is a timing diagram of the signals corresponding to the reading of an erased (blank) cell using a reading device according to the present invention.
Figure 4:
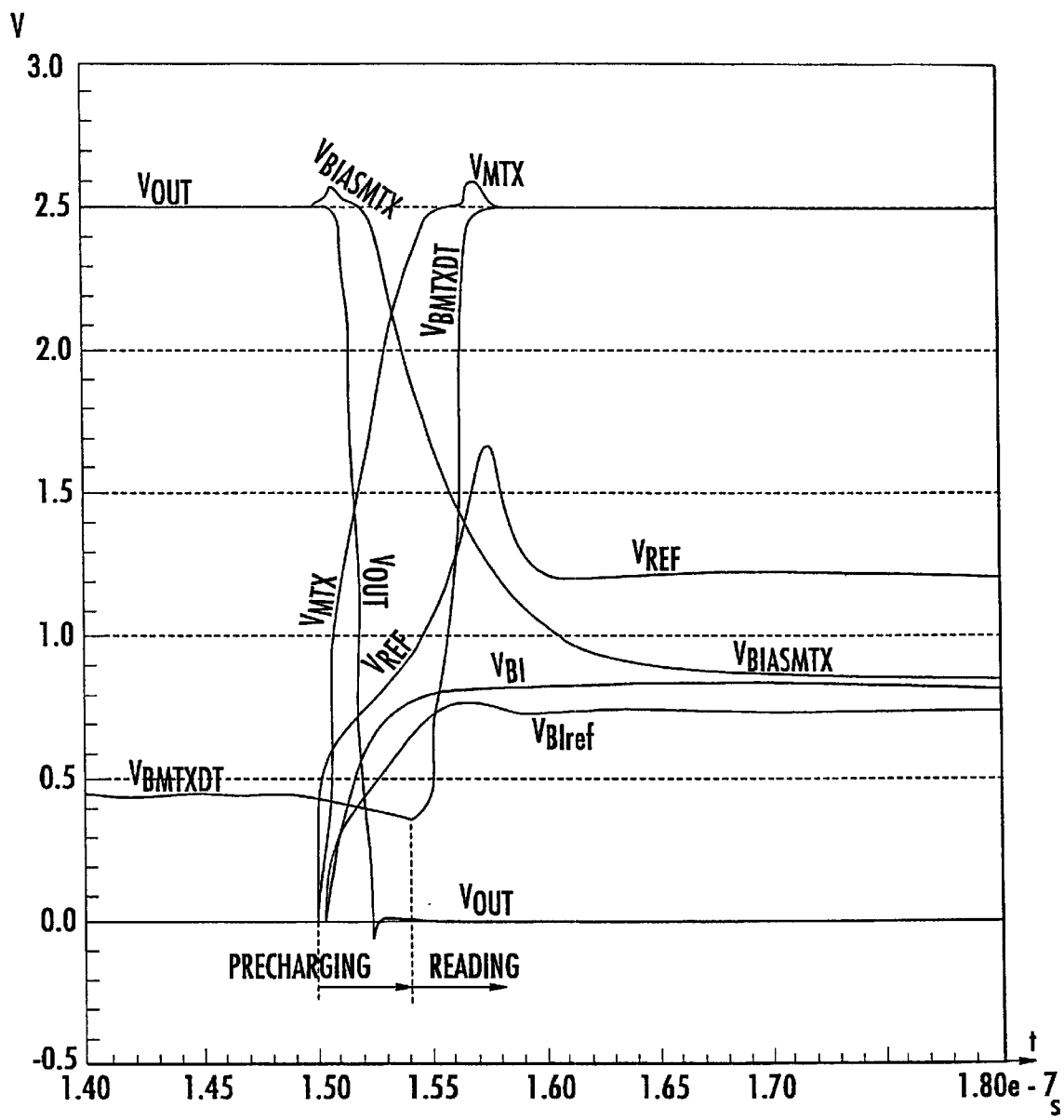
FIG. 4 is a timing diagram of the signals corresponding to the reading of a programmed cell using a reading device according to the present invention.

Thus, on the data bit-line side, the source of the transistor Tp of the CIVD converter rises to the precharging read voltage V1 while, at the same time, the drain of this transistor rises to a level close to VDD. It is the automatic control loop of the converter that prevents the source of the transistor from rising above V1. As represented in FIG. 3 or 4, the voltage Vbl of the data bit line rises quickly to its read precharging voltage level V1 (close to 1 volt) while the data input MTX of the differential amplifier rises to a voltage VMTX close to the supply voltage VDD.

On the reference bit line side, the source of the transistor Tp of the converter CIVD rises to a read precharging voltage V2 close to 1 volt while, at the same time, the drain of this transistor rises to a level defined by the chain of MOS transistors, T2, T3, T4 and the reference cell. It is the automatic control loop that prevents the source of the transistor Tp from rising above V2. Thus, as shown in FIG. 3 or 4, the voltage $V_{BL}$ of the data bit line rises more slowly to its level of precharging voltage V2 (close to 1 volt) while the reference input of the differential amplifier rises to a voltage level $V_{REF}$ lower than the level of the voltage $V_{MTX}$.

There is then a voltage difference between the two inputs MTX and REF of the differential amplifier sufficient to make its output switch over into the desired state, while the two bit lines, namely the data bit line and the reference bit line, are substantially precharged to the same level (close to 1 volt). This difference in voltage between the two inputs of the amplifier is obtained quickly because of the acceleration of the precharging on the data bit line side through the use of a precharging current Ipch that is much higher than the read current. At the end of the precharging, the output Out of the amplifier switches over into a known state, which is a logic 0 in the example ($V_{OUT}$ in FIGS. 3 and 4).

When the voltage $V_{MTX}$ of the data input MTX reaches a high level that is sufficient in comparison with the voltage $V_{REF}$, then the asymmetrical precharging circuit 4 must be cut off in order to go into the evaluation phase. This is obtained by the circuit 5 for the detection of the stopping conditions. This detection circuit 5 must allow the voltage on the input MTX to rise to a level that is appreciably higher than the voltage at the input REF. Several possibilities of detection can be considered, and will be described in detail further below. This detection circuit gives a stop command signal $V_{BMTX}$ at the output. The logic circuit 6 applies a stop command voltage to the command signal PCHN of the asymmetrical precharging circuit 4. In the example, the transistor T8 goes to the off state.

When the asymmetrical precharging circuit 4 is cut off, there is only the current of the read generator, namely $I_D=I_R/2$ on the data bit line side and $I_R$ on the reference bit line side. The reading device then goes into the evaluation phase. The evaluation begins as soon as the data and reference cells are selected by the row decoder of the memory circuit with the application of an appropriate gate command voltage to these cells.

The data cell is biased under the same conditions as the reference cell. If it is a blank cell, then it has the capacity to absorb as much current as the reference cell. If the data cell is a blank or erased cell, which is the case corresponding to FIG. 3 since the read current generator can give it with only a fraction $I_D$ of this reference current, this cell starts by discharging-the bit line capacitance. Then it brings about a collapse in the voltage at the output node SD of the converter CIVD and the amplifier switches over. The voltage Vout goes from 0 to VDD.

If the data cell is programmed, which is the case corresponding to FIG. 4, then the data cell does not absorb any current. The voltage $V_{MTX}$ remains unchanged and so does the output of the amplifier. In the example, the output voltage Vout remains at zero. Thus, without sequencing signals other than the bit line selection and row selection signals given by the decoders of the memory and the read command signal SON, the data element is obtained very quickly at the output.

The asymmetrical precharging reading device must be activated after the bit lines (data and reference bit lines) have been selected, and hence effectively connected by a converter to a corresponding input of the amplifier. If this were not the case, the asymmetrical precharging would make the requisite input of the amplifier rise very quickly to the higher voltage level since there would be no charge at this input. This would make the device go into the evaluation phase far too quickly before the bit lines selected after the activation of the reading device have had the actual time to rise to their precharging voltage level. This would lead to a malfunctioning of the unit.

Usually, the read amplifier comprises an amplifier stage with two arms and an inverter type output stage connected to a connection node of one of the arms of the amplifier stage. The output of the inverter stage gives the output Out of the amplifier. The amplifier will not be described in any further detail. It has numerous alternative embodiments well known to those skilled in the art.

Figure 2:
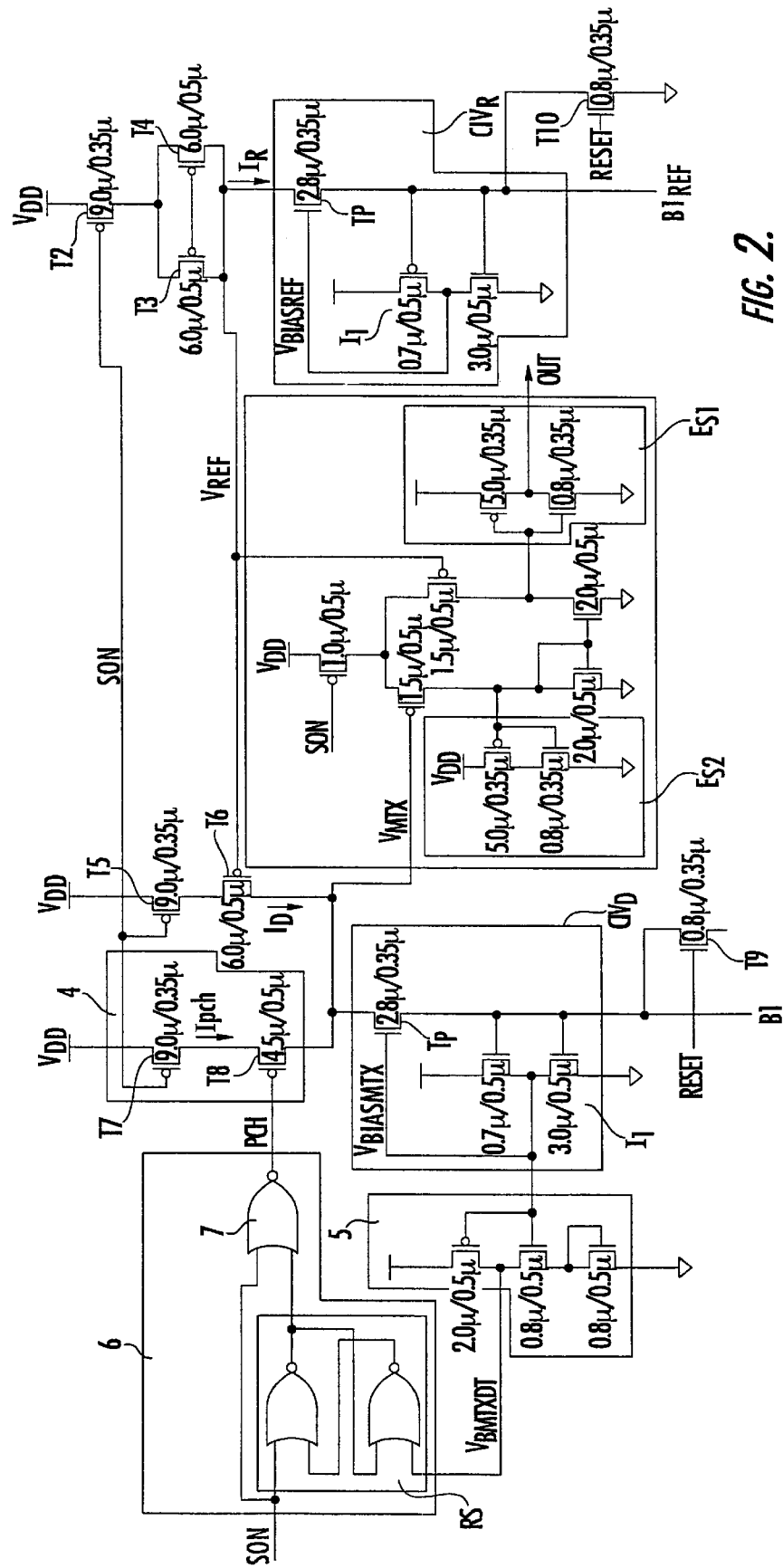
FIG. 2 is a detailed circuit diagram of the structures illustrated in FIG. 1.

In an improvement of the invention shown in FIG. 2, it is planned to size the output stage of the amplifier to favor its switching over into the direction opposite of that of the precharging. Thus, in the example, the output Out of the amplifier is brought to a logic 0 in the precharging phase. The output stage is then sized to favor the switching over of this output from a 0 to a 1. The response time of the entire read chain is then improved.

FIG. 2 thus shows an output stage Es1 with a CMOS inverter whose PMOS transistor is oversized (W/L=$5\mu$/$0.35\mu$) as compared with the NMOS transistor (W/L=$0.8\mu$/$0.35\mu$) to favor the switching over of the output of the amplifier in the desired direction, which is from a 0 to a 1 in this case.

To make symmetrical the charging on the amplifying stage, it is usual to plan an output reference stage or a dummy stage connected to a connection point of the other arm, and having the same charging characteristics as the output stage that is really used. The dummy stage is the output stage Es2 shown in FIG. 2. Since this inverter stage is not used operationally, it is planned that each transistor of this inverter stage will have its source and its drain short-circuited and connected to the power supplies so that this inverter does not consume current at any time.

A detection circuit 5 is needed to stop the asymmetrical precharging circuit. In the example illustrated in FIG. 2, it is sought to detect the level of the gate command signal $V_{BIASMTX}$ for the precharging transistor of the current/voltage converter CIVD. This detection may be obtained by a simple inverter I2 calibrated to switch over after the switching over of the converter.

At the beginning of a precharging phase, this $V_{BIASMTX}$ signal is at the level VDD to make the transistor Tp highly conductive, thus enabling the voltage build-up of its source. The level gradually decreases as and when the source voltage increases by the effect of the negative feedback loop (I1).

The inverter I2 is calibrated to switch over to a level Vdet after the inverter I1. As soon as the signal $V_{BIASMTX}$ crosses the level Vdet, the asymmetrical precharging circuit 4 is cut off. This is what marks the end of the precharging phase and the beginning of the evaluation phase.

At the time of this evaluation phase, if the memory cell selected in the read mode is a blank cell (FIG. 3), it will draw more current than the current generator can provide. By the effect of the negative feedback loop, the precharging transistor Tp again becomes highly conductive. The level of the gate signal $V_{BIASMTX}$ again becomes high. The inverter I2 of the detection circuit 5 switches over into the other direction and tends to restart the asymmetrical precharging circuit 4. This is why the logic circuit 6 should be designed to comprise a memory element so as not to allow the reactivation of the asymmetrical precharging circuit 4 during the evaluation phase. This can be simply obtained by an RS flip-flop circuit, as will be seen further below.

If the memory cell selected in reading is programmed (FIG. 4), the precharging transistor Tp of the negative feedback loop becomes less and less conductive. The gate command signal V$_{BIASMTX}$ is drawn towards the precharging level of the bit lines (1 volt approximately). Other possibilities of detection can be considered. In particular, the detection can be done on the voltage level of the output signal Out of the amplifier or on the signal S$_D$.

FIG. 2 shows a detailed example of a read circuit according to the invention. In particular, the inverter I1, the circuit detection 5 and the logic circuit 6 are described in detail. The inverter I1 is a CMOS type inverter with N and P transistors. The detection circuit 5 comprises a CMOS type inverter I2 with N and P transistors, an additional diode-mounted transistor being provided in the arm N so that the switching at the output from a 0 to a 1 corresponds to the detection of the stopping conditions of the asymmetrical precharging circuit. This occurs at a level higher than the 0 to 1 switching of the inverter I1. In other words, the signal V$_{BIASMTX}$ at output of the inverter I1 should be capable of falling to the level Vdet of detection of the inverter I2.

It has been seen that, in this context, the logic circuit 6 should comprise a memory element to take account of only the first switching over of the inverter I2. This memory element, in the example, is an RS flip-flop circuit whose setting input (Set) receives the reading device command signal SON, which is active on level 1, and whose resetting input (Reset) receives the stop detection signal V$_{BMTX}$ provided by the detection circuit 5. The data output Q of the flip-flop circuit gives a stop signal which, once it is positioned, no longer changes until the next reading operation. It is combined with the activation command signal SON in a logic gate 7, which in the example is a NOR type gate that gives the activation command PCH for activating the asymmetrical precharging circuit according to the invention.

FIG. 2 shows a detailed view of a differential amplifier that can be used in the invention. This differential amplifier comprises a selection switch transistor T9 commanded by the command signal SON to power on the amplifier. Discharge transistors T10 and T11 are usually provided for discharging the bit lines (FIGS. 1 and 2). First, the bit lines are initialized, which is namely the data and reference lines. Second, the consumption of the reading module is reduced when it is not being used.

A reading device according to the invention, with detection of the stopping conditions of the asymmetrical precharging, allows for a very fast auto-sequenced operation. In practice, the data element may be obtained at the output within about 20 to 30 nanoseconds.

In the above description of an embodiment of a reading device according to the present invention, the asymmetrical precharging circuit brings the data input of the amplifier to a voltage level higher than the reference data input. It has been seen that it can be arranged for the reference data input to be brought to a voltage level higher than that of the data input. Those skilled in the art will be able to adapt the device described so that the additional precharging current is injected into the reference bit line, and carry out some adaptations to obtain the accurate copying of the read current in the evaluation phase to obtain a corresponding reading device. In the example, for the stop condition detection circuit more particularly described, those skilled in the art will be able to place the inverter I2 on the same side as the converter associated with the reference bit line.

That which is claimed is:

1. A method of reading an integrated circuit memory comprising at least one memory cell to be read, at least one reference memory cell, a data bit line connected to the at least one memory cell and a reference bit line connected to the at least one reference memory cell, the method comprising:

applying a data signal to a data input of a differential amplifier, and applying a reference signal to a reference input of the differential amplifier;

providing a reference current to the reference bit line and a fraction of the reference current to the data bit line using a read current generator connected to the differential amplifier; and performing an asymmetrical precharging for causing the data signal being received at the data input of the differential amplifier to be at a level higher than the reference signal being received at the reference input of the differential amplifier for switching an output signal of the differential amplifier to a corresponding logic state.

2. A method according to claim 1, further comprising:

generating the data signal using a data converter having an input connected to the data bit line; and generating the reference signal using a reference converter having an input connected to the reference bit line.

3. A method according to claim 1, wherein performing the asymmetrical precharging comprises accelerating precharging on the data bit line based upon a precharging current on the data bit line being higher than a precharging current on the reference bit line.

4. A method according to claim 3, further comprising performing a precharging for bringing the data bit line to a precharge voltage; and wherein the precharging current on the data and reference bit lines is provided by the read current generator, with the precharging current for the data bit line being augmented by a current provided by the asymmetrical precharging.

5. A method according to claim 4, wherein performing the asymmetrical precharging and activating the read current generator is based upon detection of a memory read command; and wherein the asymmetrical precharging is disabled based upon detection of a stopping condition that corresponds to a voltage difference between the data singal and the reference signal being applied to the differential amplifier.

6. A method according to claim 5, wherein the memory read command is generated during or after selection of the data and reference bit lines.

7. A memory according to claim 1, wherein the at least one memory cell is configured so that the integrated circuit memory is at least one of an erasable programmable read only (EPROM) type memory and a one-time programmable (OTP) type memory.

8. A method of reading an integrated circuit memory comprising a memory cell to be read, a reference memory cell, a data bit line connected to the memory cell and a reference bit line connected to the reference memory cell, the method comprising:

performing a precharging for bringing the data bit line to a precharge voltage;

performing an evaluation based upon a generation of a data signal using a data converter having an input connected to the data bit line, generation of a reference signal using a reference converter having an input connected to the reference bit line, the data and reference signals being applied to respective inputs of a differential amplifier, and by providing a reference current to the reference bit line and a fraction of the reference current to the data bit line using a read current generator connected to the differential amplifier; and performing an asymmetrical precharging during the precharging for causing the data signal being received at the data input of the differential amplifier to be at a level higher than the reference signal being received at the reference input of the differential amplifier for switching an output signal of the differential amplifier to a corresponding logic state.

9. A method according to claim 8, wherein performing the asymmetrical precharging comprises accelerating precharging on the data bit line based upon a precharging current on the data bit line being higher than a precharging current on the reference bit line.

10. A method according to claim 9, wherein the precharging current on the data and reference bit lines is provided by the read current generator, with the precharging current for the data bit line being augmented by a current provided by the asymmetrical precharging.

11. A method according to claim 10, wherein performing the asymmetrical precharging and activation of the read current generator is based upon detection of a memory read command; and wherein the asymmetrical precharging is disabled based upon detection of a stopping condition that corresponds to a voltage difference between the data input and the reference input of the differential amplifier.

12. A method according to claim 11, wherein the memory read command is generated during or after selection of the data and reference bit lines.

13. A memory according to claim 8, wherein the at least one memory cell is configured so that the integrated circuit memory is at least one of an erasable programmable read only (EPROM) type memory and a one-time programmable (OTP) type memory.

* * * * *